(12) United States Patent
Iwane

(10) Patent No.: US 7,899,631 B2
(45) Date of Patent: Mar. 1, 2011

(54) METHOD AND DEVICE FOR ESTIMATING BATTERY RESIDUAL CAPACITY, AND BATTERY POWER SUPPLY SYSTEM

(75) Inventor: Noriyasu Iwane, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 300 days.

(21) Appl. No.: 12/041,972

(22) Filed: Mar. 4, 2008

(65) Prior Publication Data
US 2008/0243405 A1    Oct. 2, 2008

(30) Foreign Application Priority Data

Mar. 29, 2007 (JP) .............................. 2007-086762
May 8, 2007 (JP) .............................. 2007-123729

(51) Int. Cl.
G01R 31/36 (2006.01)
(52) U.S. Cl. .......................................... 702/63; 320/149
(58) Field of Classification Search .................. 702/57, 702/60–65, 79–80, 176–177, 179, 181; 320/127–128, 320/130, 132–137, 155–157, 149
See application file for complete search history.

(56) References Cited

U.S. PATENT DOCUMENTS

| 5,819,864 | A * | 10/1998 | Koike et al. ................. 180/65.1 |
| 7,202,632 | B2 * | 4/2007 | Namba ........................ 320/132 |
| 7,362,074 | B2 | 4/2008 | Iwane et al. |
| 7,405,571 | B1 * | 7/2008 | Liu ............................ 324/430 |
| 2002/0113594 | A1 | 8/2002 | Satake |
| 2006/0208704 | A1 | 9/2006 | Iwane et al. |
| 2006/0244458 | A1 * | 11/2006 | Cho et al. .................... 324/426 |
| 2006/0261782 | A1 * | 11/2006 | Kim et al. .................... 320/132 |
| 2006/0279289 | A1 * | 12/2006 | Denning ..................... 324/427 |
| 2007/0096743 | A1 * | 5/2007 | Arai et al. .................... 324/426 |
| 2007/0170892 | A1 * | 7/2007 | Ishii ........................... 320/132 |
| 2007/0194754 | A1 * | 8/2007 | Fukuzawa et al. ........... 320/112 |
| 2007/0252601 | A1 | 11/2007 | Satoh et al. |
| 2008/0120050 | A1 | 5/2008 | Iwane et al. |

FOREIGN PATENT DOCUMENTS

| JP | 7-98367 | 4/1995 |
| JP | 2002-234408 | 8/2002 |
| JP | 2005-43339 | 2/2005 |

OTHER PUBLICATIONS

U.S. Appl. No. 11/987,615, filed Dec. 3, 2007, Iwane, et al.
U.S. Appl. No. 12/049,907, filed Mar. 17, 2008, Iwane, et al.

* cited by examiner

Primary Examiner—Andrew Schechter
Assistant Examiner—Mary C O'Malley
(74) Attorney, Agent, or Firm—Oblon, Spivak, McClelland, Maier & Neustadt, L.L.P.

(57) ABSTRACT

In the method for estimating battery residual capacity of the present invention, the voltage measurement values are obtained (step S2). And once it is finished, using the initial values of the coefficients set at the step S3 as starting, the optimization is progressed with renewing each value of the coefficients on the following iterating calculations (step S4). Once the optimum value of each coefficient in the approximation is determined at the step S4, the stable open circuit voltage is calculated by the optimized reciprocal function using thereof at the step S5. And then based thereon, the battery residual capacity is calculated by the predetermined conversion method (step S6).

8 Claims, 4 Drawing Sheets

METHOD AND DEVICE FOR ESTIMATING BATTERY RESIDUAL CAPACITY, AND BATTERY POWER SUPPLY SYSTEM

FIELD OF THE INVENTION

The present invention relates to a method and a device for estimating battery residual capacity, and a battery power supply system, to estimate based on a stable open circuit voltage ((OCV)) for the residual capacity of the battery to supply power to a load.

RELATED ART

Recently, because of a popularization of portability regarding electronic equipments and such as a hybridization or a popularization of start-stop system regarding automobiles, to accurately estimate a state of charge (SOC) or a residual capacity of a battery power supply equipped therein becomes strongly required more and more. As a method to estimate the state of charge or the residual capacity, there is a method based on a stable open circuit voltage (OCV) of the battery. This method is the most convenient, and also effective as a means to realize an accurate estimation.

However, under an actual environment in which a power supply system is used, because a charge/discharge current is almost always flowed through a battery, a polarization is always occurred in the battery. Hence, even in a period that no charge/discharge is performed, a polarization voltage is superimposed in a battery voltage. Therefore, a state that the battery voltage corresponds to the voltage of the OCV is almost not able to be expected.

Methods to estimate the stable open circuit voltage, with considering an affect of such the polarization, are disclosed for example in Japanese Patent Application Publication No. H07-98367, Japanese Patent Application Publication No. 2002-234408 and Japanese Patent Application Publication No. 2005-43339. According to these published applications, the polarization caused by charging/discharging of the battery becomes to be relaxed over time, and then the battery voltage is converged on the stable open circuit voltage. Hence, this voltage behavior is expressed as a time dependent function. Furthermore, using a measured result for the battery voltage in a relatively short time, by determining coefficients of the time dependent function, the stable open circuit voltage over relatively longer time is predicted as a technology to be proposed.

As an example, regarding the Japanese Patent Application Publication No. H07-98367, the time dependent variation of the battery voltage V(t) at the time of no charge/discharge being performed is expressed by a linear reciprocal function for the time (t) as $$V(t)=C-(a \cdot t+b)^{-1} \quad \text{(equation 1)}.$$

Using the above mentioned equation, a characteristic function F(t)=t dV(t)/dt is defined. Moreover, based on this, t=tmax (=a/b) as maximizing F(t) is evaluated. Furthermore, as a coefficient C=2 V (tmax)−V(t0), the stable open circuit voltage is calculated.

Moreover, according to the Japanese Patent Application Publication No. 2002-234408, the time dependent variation of the battery voltage V(t) at the time of no charge/discharge being performed is expressed as $$V(t)=\alpha \cdot t^{-0.5}+OCV \; (=\alpha \cdot t^D+OCV) \quad \text{(equation 2)}.$$

Furthermore, the optimum values of the coefficients α and the OCV are determined by a least squares operation. And then the optimum value of the OCV as the coefficient is regarded as the stable open circuit voltage as a method to be proposed. Furthermore, according to the Japanese Patent Application Publication No. 2005-43339, the time dependent variation of the battery voltage V(t) at the time of no charge/discharge being performed is expressed using a fourth or higher order exponential function as $$V(t)=A1 \cdot \exp(B1/t)+A2 \cdot \exp(B2 \cdot t)+ \ldots +V0 \quad \text{(equation 3)}.$$

And then the coefficients of Ai, Bi and V0 are optimized and determined by the least squares operation as a method to be proposed.

However, regarding the above mentioned technologies there are some problems as below describing. Regarding the Japanese Patent Application Publication No. H07-98367, the time dependent variation of the battery voltage (V(t)) at the time of no charge/discharge being performed is expressed using (equation 1), however, a polarization and a relaxation behavior of the battery voltage is known that it is not a simple behavior being able to be expressed only by the above mentioned reciprocal function in (equation 1). Therefore, there is a problem existed that it is not able to predict the stable open circuit voltage in a sufficient accuracy and to estimate the battery residual capacity thereby.

Moreover, regarding the Japanese Patent Application Publication No. H07-98367, a characteristic function is defined, and the stable open circuit voltage is calculated based thereon. However, using such a method, compared to other methods to estimate the time dependent variation of the voltage (V(t)) using the optimum coefficients calculated by the method of least squares or the like, it is hard to predict the stable open circuit voltage in a high accuracy.

Furthermore, the Japanese Patent Application Publication No. 2002-234408, the time dependent variation of the battery voltage (V(t)) at the time of no charge/discharge being performed is expressed using (equation 2), and then the coefficients and the value of the OCV are determined as the optimum values at the time of the power (D) becoming approximately (−0.5). However, even using such the determined function, there is a problem existed that it is completely different from the polarization and the relaxation behavior of the actual battery voltage.

According to the Japanese Patent Application Publication No. 2005-43339, for such a problem, the time dependent variation of the battery voltage (V(t)) at the time of no charge/discharge being performed is expressed by (equation 3) using the exponential function of quaternary or more. Hence, it is possible to predict the stable open circuit voltage in an extremely high accuracy. However, in (equation 3), due to using quite often the exponential function which is complicated and has a high calculation load, there is a problem existed that the total calculation load becomes extremely high. Moreover, the exponential function varies extraordinary the value of itself with the variation of the values of the time dependent parameters, and sometimes a case happened to be occurred to indicate an astronomical numerical value during an operation process of itself. For such as a controller to be equipped in a vehicle for example, in a case of using an operation device which has a limited capacity, there is a problem existed that the numerical value becomes over an operable range of the device and then make it difficult to perform stably the operation thereof.

Here, the present invention is presented for solving such problems. Moreover, by being possible to estimate the stable open circuit voltage in a high accuracy, the residual capacity of the battery is able to be estimated in an extremely high accuracy based on the stable open circuit voltage. Furthermore, a method for estimating battery residual capacity or the like, which has relatively right calculation load, is offered and to be aimed.

SUMMARY OF THE INVENTION

The first embodiment regarding a method for estimating battery residual capacity of the present invention relates to the method for estimating the battery residual capacity based on a stable open circuit voltage, which comprises the steps of:

approximating a time (t) dependent variation of the open circuit voltage of the above mentioned battery (V(t)) by a function in which a denominator is a time (t) dependent polynomial of n-th degree (hereinafter, it is defined as a reciprocal function of n-th degree) as $$V(t) = \frac{1 + A_1 \cdot t + A_2 \cdot t^2 + \ldots + A_{n-1} \cdot t^{n-1}}{B_0 + B_1 \cdot t + B_2 \cdot t^2 + \ldots + B_n \cdot t_n} + F(t) + C,$$

where (t) is an elapsed time from when obtaining a voltage value of the battery is started after the battery has stopped charging/discharging, (n) is an integer above two, F(t) is an arbitrary function of the above mentioned time (t), and (C) is a constant;

obtaining a number of voltage values of the above mentioned battery in a predetermined time duration from when the obtaining the voltage value is started, the number of voltage values being equal to or greater than a number of coefficients in the reciprocal function of n-th degree;

determining values of the coefficients in the above mentioned reciprocal function of n-th degree, based on the above obtained voltage values, using a method of least squares, or a Kalman filter operation, or a neural network;

calculating the stable open circuit voltage from the above mentioned reciprocal function of n-th degree using the above determined values of the coefficients; and estimating the above mentioned residual capacity based on the above calculated stable open circuit voltage.

In the second embodiment of the method for estimating battery residual capacity of the present invention, the above mentioned reciprocal function of n-th degree is defined as $$V(t) = \frac{1 + A_1 \cdot t + A_2 \cdot t^2 + \ldots + A_{n-1} \cdot t^{n-1}}{B_0 + B_1 \cdot t + B_2 \cdot t^2 + \ldots + B_n \cdot t^n} + C.$$

In the third embodiment of the method for estimating battery residual capacity of the present invention, the above mentioned the time dependent variation of the open circuit voltage is approximated by the reciprocal function of n-th degree during a first time duration between the stopping of charging/discharging and the starting of obtaining the voltage value of the battery, the starting of obtaining the voltage value starting before a first reference time duration; the above mentioned time dependent variation of the open circuit voltage is approximated by the reciprocal function of (n−1) th degree during a second time duration when the starting of obtaining the voltage value starts after the first reference time duration and before a second reference time duration; and similarly approximated, at every appearance of the duration when the starting of obtaining the voltage value starts after a predetermined reference time duration, with reducing sequentially a degree of the reciprocal function one by one until the first degree is reached.

The first embodiment regarding a device for estimating battery residual capacity of the present invention relates to the device for estimating battery residual capacity based on the stable open circuit voltage comprising:

a voltage sensor to measure the voltage of the above mentioned battery; and a control unit to execute and control calculations for estimating the above mentioned residual capacity, which approximates the time (t) dependent variation of the open circuit voltage of the above mentioned battery (V(t)) by the function in which the denominator is the time (t) dependent polynomial of n-th degree (hereinafter, it is defined as a reciprocal function of n-th degree) as $$V(t) = \frac{1 + A_1 \cdot t + A_2 \cdot t^2 + \ldots + A_{n-1} \cdot t^{n-1}}{B_0 + B_1 \cdot t + B_2 \cdot t^2 + \ldots + B_n \cdot t_n} + F(t) + C,$$

where (t) is an elapsed time from when obtaining a voltage value of the battery is started after the battery has stopped charging/discharging, (n) is an integer greater than two, F(t) is an arbitrary function of the time (t), and (C) is the constant; obtains a number of voltage values of the battery in the predetermined time duration from when the obtaining the voltage value is started, the number of voltage values being equal to or greater than a number of coefficients in the reciprocal function of n-th degree; determines the values of the coefficients in the above mentioned reciprocal function of n-th degree, based on the above obtained voltage values, using the method of least squares, or the Kalman filter operation, or the neural network; calculates the stable open circuit voltage from the above mentioned reciprocal function of n-th degree using the above determined values of the coefficients; and estimates the above mentioned residual capacity based on the above calculated stable open circuit voltage.

In the second embodiment of the device for estimating battery residual capacity of the present invention, the above mentioned control unit uses $$V(t) = \frac{1 + A_1 \cdot t + A_2 \cdot t^2 + \ldots + A_{n-1} \cdot t^{n-1}}{B_0 + B_1 \cdot t + B_2 \cdot t^2 + \ldots + B_n \cdot t^n} + C$$

for the above mentioned reciprocal function of n-th degree.

In the third embodiment of the device for estimating battery residual capacity of the present invention, the above mentioned control unit approximates the above mentioned time dependent variation of the open circuit voltage by the reciprocal function of n-th degree during a first time duration between the stopping of charging/discharging and the starting of obtaining the voltage value of the battery, the starting of obtaining the voltage value starting before a first reference time duration; approximates the above mentioned time dependent variation of the open circuit voltage ((V(t))) by the above mentioned reciprocal function of (n−1)th degree during a second time duration when the starting of obtaining the voltage value starts after the first reference time duration and before a second reference time duration; and similarly approximates, at every appearance of the duration when the starting of obtaining the voltage value starts after the predetermined reference time duration, with reducing sequentially a degree of the reciprocal function one by one until the first degree is reached.

The first embodiment regarding a battery power supply system of the present invention relates to the battery power supply system comprising the battery and any one of the above mentioned device for estimating battery residual capacity.

DETAILED DESCRIPTION OF THE INVENTION

Figure 1:
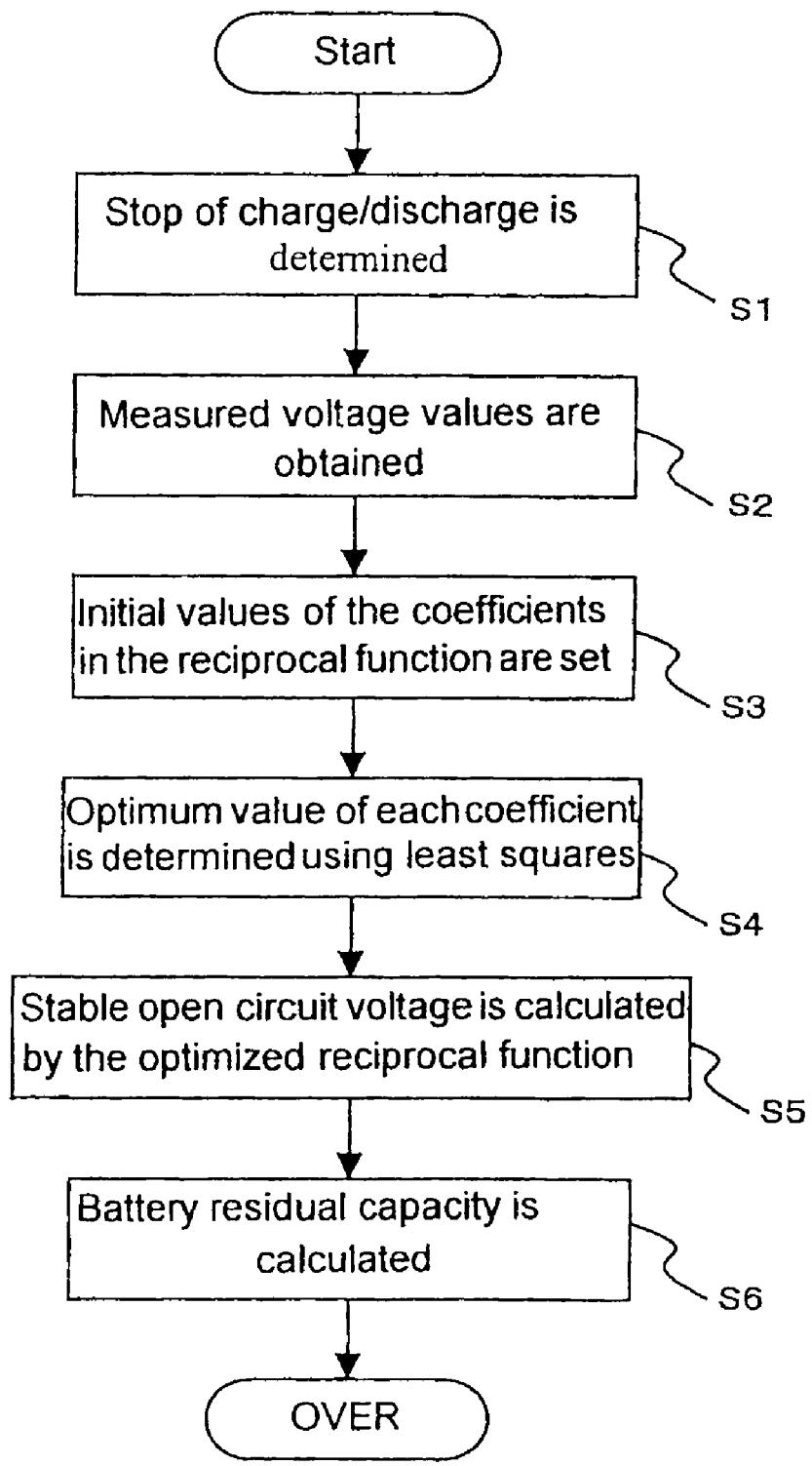
FIG. 1 is a flow chart to show the flow of the processes regarding the method for estimating battery residual capacity relates to the first embodiment of the present invention.

With referring to the drawings, a method for estimating buttery residual capacity regarding preferred embodiments of the present invention, components of a device for estimating buttery residual capacity and of a battery power supply system, are described in detail. Here, regarding each component part having a similar function, for drawing and describing simplification, it is shown using the similar symbol.

Figure 2:
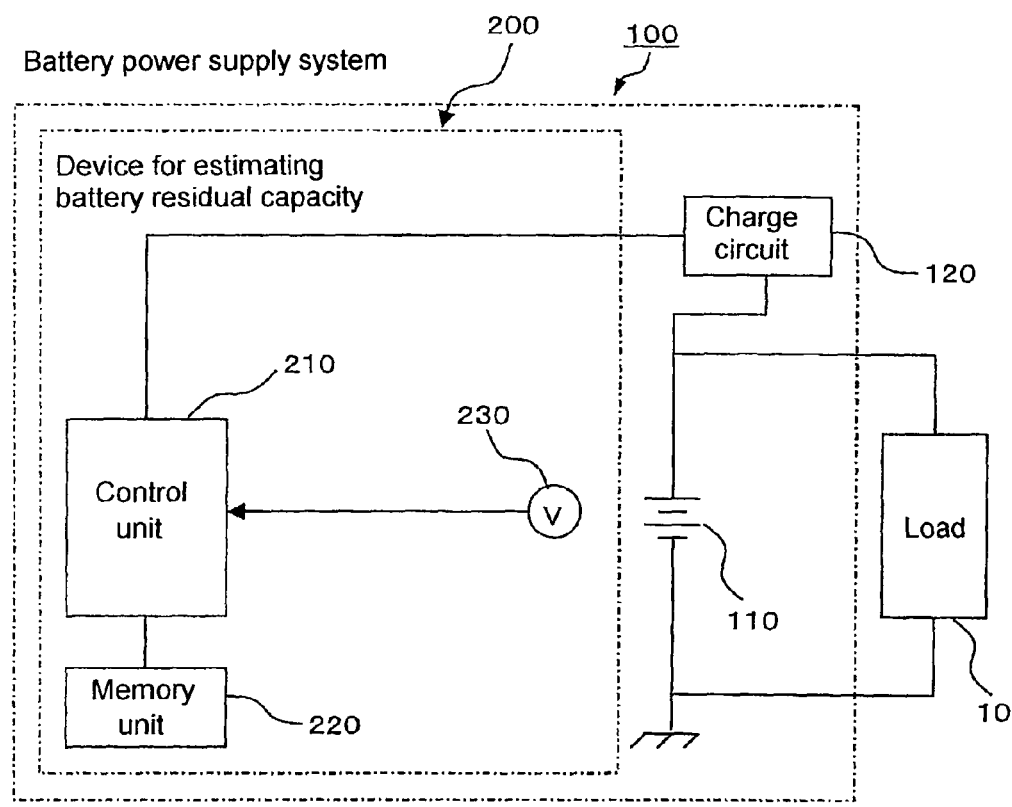
FIG. 2 is a block diagram to show a brief structure regarding the device for estimating battery residual capacity and the battery power supply system relates to the first embodiment of the present invention.

FIG. 2 is a block diagram to show a brief structure regarding the device for estimating battery residual capacity and the battery power supply system relates to an embodiment of the present invention. The battery power supply system 100 of the present embodiment is comprised of a battery 110, a charge circuit 120 and a device for estimating battery residual capacity 200 of the present embodiment. Moreover, a load 10 is connected with the battery 110.

Moreover, the device for estimating battery residual capacity 200 is equipped with a control unit 210, a memory unit 220 and a voltage sensor 230. The control unit 210 is for executing and operating operations for estimating the residual capacity using one embodiment of the method for estimating battery residual capacity of the present invention. Furthermore, it is also possible to structure for controlling a total system operation of the battery power supply system 100. In FIG. 2, it is structured that the control unit 210 controls the charge circuit 120 to make it perform charging of the battery 110.

The voltage sensor 230 measures a voltage between terminals of the battery 110 and transmits the detected voltage measurement value to the control unit 210. The memory unit 220 stores various parameters for the use of estimating operation or the like regarding the residual capacity which is processed in the control unit 210, the voltage measurement values detected by the voltage sensor 230 and the like.

In a case of applying the battery power supply system 100 of the present embodiment to the power supply system on vehicle, a lead storage battery on vehicle is used as the battery 110. Moreover, the system allows power to be supplied to the load 10 of a motor or the like which is equipped in a vehicle. The lead storage battery on vehicle is equipped with an alternator as the charge circuit 120.

Regarding the battery power supply system 100 of the present embodiment, next is a detailed description on the method for estimating battery residual capacity of the present embodiment to estimate the residual capacity of the battery 110. As mentioned above, the residual capacity of the battery 110 is strongly correlated with the stable open circuit voltage of the battery 110. Hence, it is possible to preset a correlative equation or the like to calculate the residual capacity uniquely from the stable open circuit voltage. Using such a correlative equation, by estimating the stable open circuit voltage of the battery 110 at a high accuracy, it becomes possible to estimate the residual capacity of the battery 110 at a high accuracy.

However, under actual operation circumstances of the battery 110, because charging/discharging from the battery 110 is frequently repeated, a polarization situation occurs inside the battery 110 for almost all the period, and then a polarization voltage is superimposed also on the voltage of the battery 110. An affect of such polarization is slowly reduced after stopping charge/discharge of the battery 110, however, it requires an extremely long duration of about tens of hours to several days until the affect becomes small enough. Therefore, it is quite hard to measure the open circuit voltage at the time of stable state as the polarization is eliminated, and it is not able to be expected thereof under actual operations.

Here, regarding the method for battery residual capacity of the present embodiment, a function is used, which is able to approximate at a high accuracy regarding a time variation of the open circuit voltage after the stop of charging/discharging. Moreover, using a voltage measurement value of the open circuit voltage detected by the voltage sensor 230, coefficients of the above mentioned function are determined. Therefore, it is able to estimate at a high accuracy the open circuit voltage at the time of the battery 110 being stable.

The method for estimating battery residual capacity of the present embodiment is described in detail as below. Regarding the present embodiment, as a function to approximate accurately a time (t) dependent variation of the open circuit voltage (V(t)) after stop of charging/discharging, a function is used, in which a denominator is a time (t) dependent polynomial of n-th degree (hereinafter, it is defined as a reciprocal function of n-th degree), such as the following equation $$V(t) = \frac{1 + A_1 \cdot t + A_2 \cdot t^2 + \ldots + A_{n-1} \cdot t^{n-1}}{B_0 + B_1 \cdot t + B_2 \cdot t^2 + \ldots + B_n \cdot t^n} + F(t) + C. \quad \text{(equation 4)}$$

where (t) is an elapsed time from when obtaining a voltage value of the battery 110, V (t) is an open circuit voltage of the battery 110, (n) is an integer above two, F(t) is an arbitrary function of the time (t), and (C) is a constant.

According to the present embodiment, the time dependent variation of the open circuit voltage V(t) is to be expressed by the reciprocal function of an equation (equation 4). Moreover, by setting the degree (n) of the reciprocal function as at least two or more, it is able to approximate accurately the time variation of the open circuit voltage (V(t)) of the battery 110. Furthermore, in (equation 4), the reciprocal function of the first term in the right-hand side is used for approximating the time variation of the polarization voltage after stopping charge/discharge. Also, the second term F (t) is able to be set arbitrarily as required.

Following is a description regarding another embodiment at the time of using a reciprocal function without using the second term F(t) as the following equation $$V(t) = \frac{1 + A_1 \cdot t + A_2 \cdot t^2 + \ldots + A_{n-1} \cdot t^{n-1}}{B_0 + B_1 \cdot t + B_2 \cdot t^2 + \ldots + B_n \cdot t^n} + C. \quad \text{(equation 5)}$$

Regarding the method for estimating battery residual capacity of the present embodiment which is executed on the device for estimating battery residual capacity 200, after charge/discharge from the battery 110 being stopped, the open circuit voltage of the battery 110 is measured using the voltage sensor 230. Moreover, based on this measured voltage value, the coefficients of $A_i$, $B_i$ and C in (equation 5) are determined.

As a method to determine the coefficients of $A_i$, $B_i$ and C in (equation 5), a method of least squares, or a Kalman filter operation, or a neural network is able to be used. In a case of using the method of least squares for example, for evaluating the optimum values of the coefficients of $A_i$, $B_i$ and C, a sum of squared deviation function such as the following equation $$M = \sum_{k=1}^{K} \{Vm(t_k) - V(t_k)\}^2 \quad \text{(equation 6)}$$

is defined. And then the values of the coefficients of $A_i$, $B_i$ and C are evaluated continuously until M becomes the minimum. Here, $Vm(t_k)$ means the measured voltage value which is obtained by the voltage sensor 230, and $t_k$ means the time of the voltage measurement point after stopping charging/discharging. Thus, the voltage measurement points are totally K points to be set.

For a method to evaluate the coefficients of Ai, Bi and C for minimizing the sum of squared deviation (M) as shown in the above expressed equation (equation 6), an iterating operation may be used, such as a Gauss-Newton method, a Levenberg-Marquardt method, or the like. As making (M) successively to be smaller from a predetermined initial value, the coefficients of Ai, Bi and C are renewed continuously to achieve to the optimum values thereby.

With an example of a quadratic reciprocal function, one embodiment to evaluate the optimum coefficients solution of this function using the Gauss-Newton method is described as below. The quadratic reciprocal function $$V(t) = \frac{1 + A_1 \cdot t}{B_0 + B_1 \cdot t + B_2 \cdot t^2} + C \quad \text{(equation 7)}$$

is re-expressed as $$V(t) = \frac{1}{\alpha 1 \cdot t + \alpha 3} + \frac{1}{\alpha 2 \cdot t + \alpha 4} + \alpha 5. \quad \text{(equation 8)}$$

Furthermore, the time dependent variation of the open circuit voltage v(t) is assumed as a discrete value which is sampled in a time interval of ΔT, and then (equation 8) is re-expressed as $$V(n) = \frac{1}{\alpha 1 \cdot \Delta T \cdot n + \alpha 3} + \frac{1}{\alpha 2 \cdot \Delta T \cdot n + \alpha 4} + \alpha 5. \quad \text{(equation 9)}$$

As a measured value of the battery voltage measured in the time interval of ΔT being Vm(n): n=1 to Ns, as a difference from the value calculated by the above mentioned expression being $$R(n) = V(n)V(n) - Vm(n) \quad \text{(equation 10)},$$

and then in the application of the method of least squares, partial differential terms regarding each coefficient of α1 to α5 are evaluated at every time of each sampling timing using the following equation (equation 11)

$$dDF\alpha 1(n) = \frac{-n \cdot \Delta T}{(\alpha 1 \cdot \Delta T \cdot n + \alpha 3)^2} \quad \text{(equation 11)}$$

$$dDF\alpha 2(n) = \frac{-n \cdot \Delta T}{(\alpha 2 \cdot \Delta T \cdot n + \alpha 4)^2}$$

$$dDF\alpha 3(n) = \frac{-1}{(\alpha 1 \cdot \Delta T \cdot n + \alpha 3)^2}$$

$$dDF\alpha 4(n) = \frac{-1}{(\alpha 1 \cdot \Delta T \cdot n + \alpha 4)^2}$$

$$dDF\alpha 5(n) = 1.$$

Moreover, based on the obtained partial differential terms regarding each coefficient of α1 to α5 at every time of each sampling timing, by the following equation (equation 12)

$$B(1, 1) = \sum_{n=1}^{Ns} \{dDF\alpha 1(n)\}^2 \quad \text{(equation 12)}$$

$$B(1, 2) = \sum_{n=1}^{Ns} \{dDF\alpha 1(n) \times dDF\alpha 2(n)\}$$

$$B(1, 3) = \sum_{n=1}^{Ns} \{dDF\alpha 1(n) \times dDF\alpha 3(n)\}$$

$$\vdots$$

$$B(5, 5) = \sum_{n=1}^{Ns} \{dDF\alpha 5(n)\}^2,$$

a Hessian matrix B (I, j) is calculated, which is a square symmetric matrix of 5 times 5 in rows and columns conforming to simultaneous equations of the method of least squares.

Furthermore, same as based on the obtained partial differential terms regarding each coefficient of α1 to α5 at every time of each sampling timing, dR1 to dR5 expressed in the following (equation 13) are calculated;

$$dR1 = -\sum_{n=1}^{Ns} \{dDF\alpha 1(n) \times R(n)\} \quad \text{(equation 13)}$$

$$dR2 = -\sum_{n=1}^{Ns} \{dDF\alpha 2(n) \times R(n)\}$$

$$dR3 = -\sum_{n=1}^{Ns} \{dDF\alpha 3(n) \times R(n)\}$$

$$dR4 = -\sum_{n=1}^{Ns} \{dDF\alpha 4(n) \times R(n)\}$$

$$dR5 = -\sum_{n=1}^{Ns} \{dDF\alpha 5(n) \times R(n)\}.$$

Assumed by (equation 13), correction variations of dd1 to dd5 on the iterating calculation for the coefficients of α1 to α5 are calculated using the following (equation 14):

$$\begin{pmatrix} dd1 \\ dd2 \\ dd3 \\ dd4 \\ dd5 \end{pmatrix} = \quad \text{(equation 14)}$$

$$\begin{pmatrix} B(1,1) & B(1,2) & B(1,3) & B(1,4) & B(1,5) \\ B(2,1) & B(2,2) & B(2,3) & B(2,4) & B(2,5) \\ B(3,1) & B(3,2) & B(3,3) & B(3,4) & B(3,5) \\ B(4,1) & B(4,2) & B(4,3) & B(4,4) & B(4,5) \\ B(5,1) & B(5,2) & B(5,3) & B(5,4) & B(5,5) \end{pmatrix}^{-1} \times \begin{pmatrix} dR1 \\ dR2 \\ dR3 \\ dR4 \\ dR5 \end{pmatrix}.$$

Until the above expressed dd1 to dd5 becoming small enough, the coefficient of α1 to α5 are renewed with following the below expressed (equation 15):

$$\begin{pmatrix} \alpha 1 \\ \alpha 2 \\ \alpha 3 \\ \alpha 4 \\ \alpha 5 \end{pmatrix} = \begin{pmatrix} \alpha 1 + dd1 \\ \alpha 2 + dd2 \\ \alpha 3 + dd3 \\ \alpha 4 + dd4 \\ \alpha 5 + dd5 \end{pmatrix}, \quad \text{(equation 15)}$$

and then the operations are repeated from (equation 9) through (equation 15). Using the above mentioned method of least squares, the time dependent variation of the open circuit voltage V(t) expressed by the reciprocal function in (equation 5) is approximated as corresponding to the voltage measurement value Vm($t_k$) at a high accuracy. Moreover, it becomes also possible to estimate for relatively long time period in a high accuracy regarding the time dependent variation of the open circuit voltage. Furthermore, according to the method for estimating battery residual capacity of the present embodiment, because of completely no use of any exponential functions during the above mentioned calculation process, the load of the operation process to optimize the coefficients in the approximation for the open circuit voltage is drastically reduced.

Figure 3:
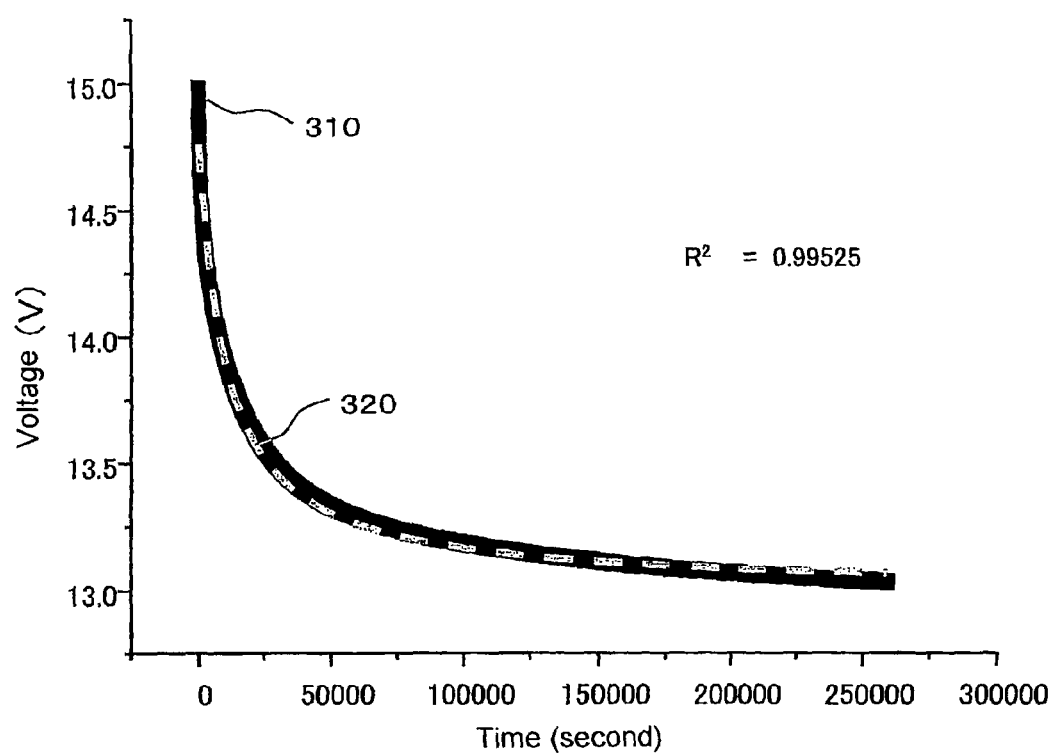
FIG. 3 is a graph to compare the measured value with the approximation result of the reciprocal function regarding the open circuit voltage.

One example of which the open circuit voltage is approximated using the reciprocal function as expressed in (equation 5) is shown in FIG. 3. For the approximation shown in the graph, the following quadratic reciprocal function illustrated in equation 16 is used.

$$V(t) = \frac{1 + A_1 \cdot t}{B_0 + B_1 \cdot t + B_2 \cdot t^2} + C \quad \text{(equation 16)}$$

In FIG. 3, a thick solid line 310 represents the measurement value and a dashed line 320 represents (equation 16) the open circuit voltage. As shown in the graph, the equation 320 for the open circuit voltage, which is approximated by the above expressed quadratic reciprocal function, is expressed as extremely well corresponding to the measurement value 310. Moreover, ($R^2$), which represents a degree of correspondence between the equation 320 for the open circuit voltage and the measurement value 310, indicates a value of 0.99525, which is quite close to 1.

As other method for determining the coefficients of $A_i$, $B_i$ and C in (equation 5), there are Kalman filter operation and neural network. Here, regarding the Kalman filter operation, the coefficients of $A_i$, $B_1$ and C, or an expression including the coefficients are set as a state vector $X_k$, and then a Jacobian matrix, which determines one period forward prediction in a time series for the state vector, and an observation equation to calculate V($t_k$) as the observed value from the state vector are defined. Using these and initial values of the preset coefficients of Ai, Bi and C, starting from the first measurement value of $V_1(t_1)$ for k=1, the voltage observation is progressed. Moreover, as the observation number k of the voltage measurement value progresses, to minimize an error between the measured value Vm($t_k$) and the calculation value V($t_k$), by following the Kalman filter algorithm, Kalman gain calculation, successive renewal of the state vector $X_k$, and the one period forward prediction of the state vector are repeated. Therefore, as the observation being progressed, the coefficients of $A_i$, $B_1$ and C are able to be successively optimized.

Moreover, for a case of using the neural network, a proper network such as a multilayer perceptron is selected. Moreover, measured values of the voltage and a various examples of the optimized coefficients of Ai, Bi and C for the measured values are sufficiently prepared, and then using these as teacher signals, the network is educated by a proper method such as a back-propagation. Furthermore, the measured values of the voltage are given as inputs to the network, and then it becomes possible to obtain the optimum values of the coefficients of $A_i$, $B_i$ and C as outputs.

Regarding the method for estimating battery residual capacity, which is executed on the device for estimating battery residual capacity 200 of the present embodiment using the method of least squares, it is described in further detail using the flow chart shown in FIG. 1. First, at step S1, a stopping of charging/discharging the battery 110 is determined. Then at step S2, voltage of the battery 110 (an open circuit voltage) is measured using the voltage sensor 230. For this measurement, measured voltage values having a number equal to or greater than a number of the coefficients included in the reciprocal function of (equation 4) or (equation 5) to approximate the open circuit voltage are obtained.

Once obtaining the measured voltage values is finished, at step S3, initial values of the coefficients in the reciprocal function to be optimized by the method of least squares are set. Moreover, at step S4, using the initial values of the coefficients set at the step S3 as starting values, the optimization is progressed with renewing each value of the coefficients on the following repeated calculations. Once the optimum value of each coefficient in the approximation is determined at the step S4, the stable open circuit voltage is calculated at step S5 by the optimized reciprocal function using thereof.

Moreover, at step S6, based on the stable open circuit voltage calculated at the step S5, the battery residual capacity is calculated by a predetermined conversion method. Furthermore, for the conversion from the stable open circuit voltage to the battery residual capacity, a conversion equation or the like, which is predefined and stored in the memory unit 220, is able to be used.

Another embodiment of the method for estimating battery residual capacity of the present invention is described below. Regarding this embodiment, as a function to approximate the open circuit voltage of the battery 110, the reciprocal function in (equation 4) or (equation 5) is used as well. Following is a description using the degree (n) as four, as one example, of the reciprocal function in (equation 5). Thus, the open circuit voltage of the battery 110 is expressed as the following equation:

$$V(t) = \frac{1 + A_1 \cdot t + A_2 \cdot t^2 + A_3 \cdot t^3}{B_0 + B_1 \cdot t + B_2 \cdot t^2 + B_3 \cdot t^3 + B_4 \cdot t^4} + C. \quad \text{(equation 17)}$$

The time dependent variation of the open circuit voltage of the battery 110 after stop of charging/discharging, as shown in FIG. 3 for example, shows a rapid change immediately after stop of charging/discharging, and then shows gradual change with elapsing time. Therefore, regarding the time dependent variation of the open circuit voltage as shown in such FIG. 3, it is possible to be approximated at a high accuracy by using (equation 17). In particular, for highly accurate approximating rapid changes immediately after stop of charging/discharging, it is preferable to use reciprocal functions of high degree such as (equation 17).

However, the time dependent variation of the open circuit voltage gradually changes with elapsing time. Hence, to approximate the gradual change of the open circuit voltage after elapsing a predetermined time since charge/discharge is stopped, it is not always necessary to use the reciprocal function of high degree. Therefore, regarding the present embodiment, corresponding to the time interval from stop of charging/discharging to a measurement starting for the open circuit voltage of the battery 110, the degree (n) of the reciprocal function used for the approximation of the open circuit voltage is set to be reduced.

First, a time interval between stop of charging/discharging of the battery 110 and start of the voltage measurement of the battery 110 by the voltage sensor 230 is assumed as (tx). And then for a case of the time (tx) being below the first reference time duration, (equation 17) is used as the approximation of the open circuit voltage. Moreover, for a case of the time (tx) being over the first reference time duration, as the approximation of the open circuit voltage, the following equation is used, as the order of the reciprocal function in (equation 17) is reduced with one:

$$V(t) = \frac{1 + A_1 \cdot t + A_2 \cdot t^2}{B_0 + B_1 \cdot t + B_2 \cdot t^2 + B_3 \cdot t^3} + C. \quad \text{(equation 18)}$$

Moreover, for a case of the time (tx) being over the second reference time duration, as the approximation of the open circuit voltage, the following equation is used, as the order of the reciprocal function in (equation 18) is reduced with one more:

$$V(t) = \frac{1 + A_1 \cdot t}{B_0 + B_1 \cdot t + B_2 \cdot t^2} + C. \quad \text{(equation 19)}$$

Furthermore, for a case of the time (tx) being over the third reference time duration, as the approximation of the open circuit voltage, the following equation is used, as the order of the reciprocal function in (equation 19) is reduced with one more:

$$V(t) = \frac{1}{B_0 + B_1 \cdot t} + C. \quad \text{(equation 20)}$$

Here, the degree (n) in (equation 20) is achieved to one degree, and then any reciprocal function, of which degree (n) is reduced more than this, is not used.

As described above, by reducing the order (n) of the reciprocal function, which approximates the open circuit voltage of the battery 110 by following the time duration between stop of charging/discharging and start of the voltage measurement, it becomes possible to shorten a calculation time required for the optimum approximation of the reciprocal function.

Figure 4:
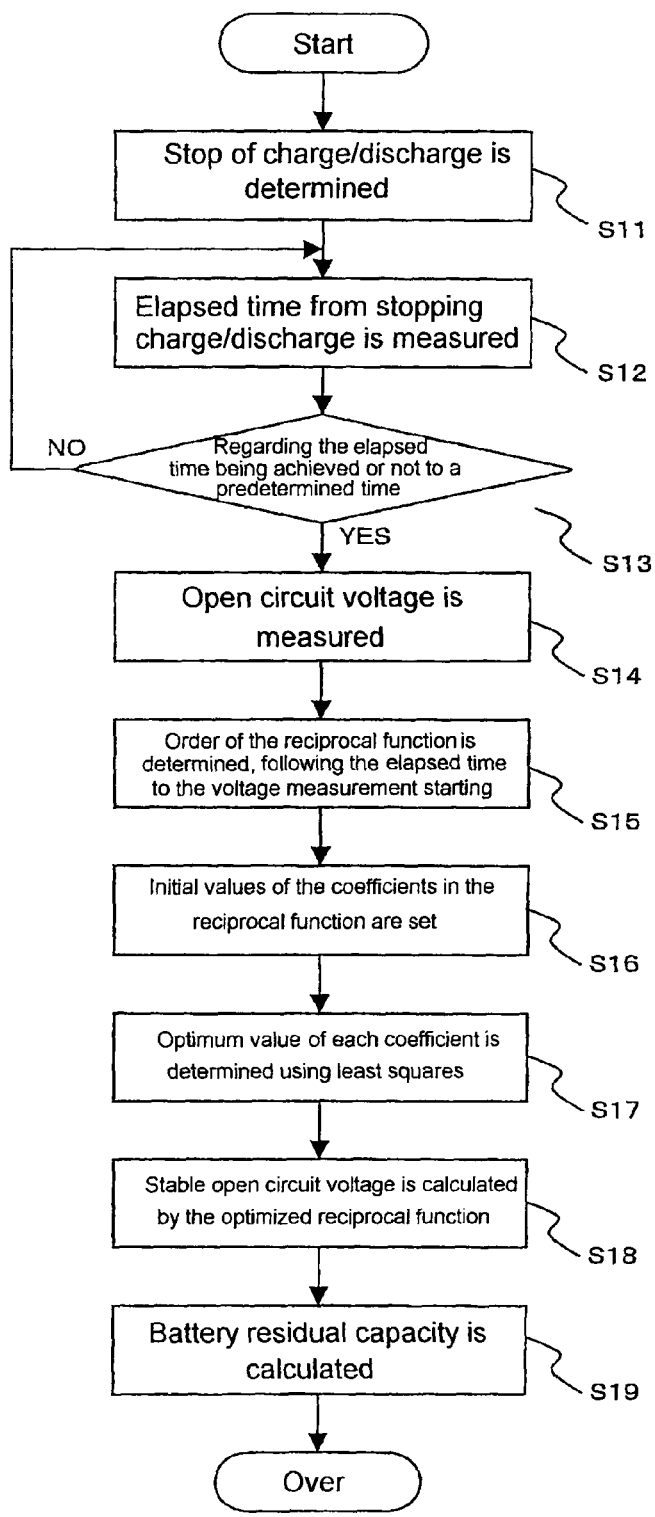
FIG. 4 is a flow chart to show the flow of the processes regarding the method for estimating battery residual capacity relates to the second embodiment of the present invention.

The method for estimating battery residual capacity of the above mentioned present embodiment is further described in detail using a flow chart as shown in FIG. 4. First, at step S11, stop of charging/discharging from the battery 110 is determined. And then at step S12, an elapsed time from stop of charging/discharging is measured.

Moreover, regarding the elapsed time from stop of charging/discharging being achieved or not to a predetermined time duration, it is determined at step S13. And then at step 14, the voltage (the open circuit voltage) of the battery 110 is measured using the voltage sensor 230. Regarding the measurement, voltage measurement values are obtained, of which the number or more of coefficients included in the reciprocal function in (equation 4) or (equation 5) for approximating the open circuit voltage.

Once obtaining the measured voltage values is finished, at step S15, by following an interval of the elapsed time to start of the voltage measurement of the battery 110, the order of the reciprocal function to approximate the open circuit voltage in (equation 4) or (equation 5) is determined. Moreover, at step 16, initial values of the coefficients optimized using the method of least squares in the reciprocal function are set. Furthermore, at step S17, using the initial values of the coefficients set at the step S16 as starting, the optimization is progressed with renewing each value of the coefficients on the following repeated calculations. Once at the step S17 the optimum value for each coefficient is determined, and then at step S18, the stable open circuit voltage is calculated by the reciprocal function which is optimized using thereof.

Moreover, at step S19, based on the stable open circuit voltage calculated at the step S17, a battery residual capacity is calculated by a predetermined conversion method. Moreover, for the conversion from the stable open circuit voltage to the battery residual capacity, a conversion equation or the like, which is predefined and stored in the memory unit 220, is able to be used.

Furthermore, according to the method for estimating battery residual capacity of the present embodiment, because of completely no use of any exponential functions during the above mentioned calculation process, the load of the operation process to optimize the coefficients in the approximation for the open circuit voltage is drastically reduced.

As described above, regarding the method for estimating battery residual capacity of the present invention, the time dependent characteristic of the open circuit voltage of the battery is approximated by the reciprocal function of second degree or more. Hence, the convergent value of the open circuit voltage becomes possible to be evaluated in a relatively short time. Moreover, it becomes possible to estimate the state of charging of the battery accurately and stably with relatively less calculation load. Furthermore, compared to the methods using exponential functions, which become sometimes hard to perform operations in a stable manner due to extraordinarily varying the value of itself with the variation of the values of the time dependent parameters. However, according to the method of estimating battery residual capacity of the present invention using the reciprocal functions, it is possible to perform the operations in a stable manner.

Regarding the present embodiment, the open circuit voltage is approximated using only the reciprocal functions, however, there is no problem at all in properly combining the described functions with other functions, such as exponential functions for example. In this case, each degree of the reciprocal functions and each degree of the exponential functions are properly selected with considering a calculation load and a required accuracy. For this case, there is no problem at all on the combination of a linear reciprocal function and an exponential function of third degree or less.

As described above, according to the present invention, the time dependent characteristic of the open circuit voltage of the battery is approximated by the reciprocal function having a degree of two or more. Hence, it is possible to evaluate the convergent value of the open circuit voltage in a relatively short time. Furthermore, it is possible to estimate the state of charge of the battery accurately and stably with relatively less calculation load. Therefore, it becomes possible to offer the method for estimating state of charge or the like thereby.

Additionally, the description regarding the present embodiment is to describe one example on the method and device for estimating battery residual capacity and the battery power supply system of the present invention, thus it is not confined therein. Furthermore, regarding such as a fine structure and a detailed operation of the method or the like for estimating battery residual capacity of the present embodiment, it is possible to modify properly along the object of the invention without deviating therefrom.

What is claimed is:

1. A method for estimating battery residual capacity based on a stable open circuit voltage (OCV), the method comprising:

approximating, in a control unit, a time dependent variation of the open circuit voltage of the battery with a function in which a denominator is a time dependent polynomial of n-th degree, defined as a reciprocal function of n-th degree by the relationship $$V(t) = \frac{1 + A_1 \cdot t + A_2 \cdot t^2 + \ldots + A_{n-1} \cdot t^{n-1}}{B_0 + B_1 \cdot t + B_2 \cdot t^2 + \ldots + B_n \cdot t^n} + F(t) + C,$$

where (t) is an elapsed time from when obtaining a voltage value of the battery is started after the battery has stopped charging/discharging, (n) is an integer greater than two, F(t) is an arbitrary function of the time (t), A and B are coefficients in the reciprocal function of n-th degree, and (C) is a constant;

obtaining, via a voltage sensor, a number of voltage values of the battery in a predetermined time duration from when the obtaining the voltage value is started, the number of voltage values being equal to or greater than a number of coefficients in the reciprocal function of n-th degree;

determining, in the control unit, values of the coefficients in the reciprocal function of n-th degree based on the obtained voltage values using a method of least squares, or a Kalman filter operation, or a neural network;

calculating, in the control unit, the stable open circuit voltage from the reciprocal function of n-th degree using the determined values of the coefficients; and estimating, in the control unit, the residual capacity based on the calculated stable open circuit voltage.

2. The method for estimating battery residual capacity of claim 1, wherein the reciprocal function of n-th degree is $$V(t) = \frac{1 + A_1 \cdot t + A_2 \cdot t^2 + \ldots + A_{n-1} \cdot t^{n-1}}{B_0 + B_1 \cdot t + B_2 \cdot t^2 + \ldots + B_n \cdot t^n} + C.$$

3. The method for estimating battery residual capacity of claim 1 or 2, wherein the time dependent variation of the open circuit voltage is approximated by the reciprocal function of n-th degree during a first time duration between the stopping of charging/discharging and the starting of obtaining the voltage value of the battery, the starting of obtaining the voltage value starting before a first reference time duration, the time dependent variation of the open circuit voltage is approximated by the reciprocal function of (n−1)th degree during a second time duration when the starting of obtaining the voltage value starts after the first reference time duration and before a second reference time duration; and the time dependent variation of the open circuit voltage is similarly approximated, at every appearance of the duration when the starting of obtaining the voltage value starts after a predetermined reference time duration, with reducing sequentially a degree of the reciprocal function one by one until the first degree is reached.

4. A device for estimating battery residual capacity based on the stable open circuit voltage (OCV) comprising:

a voltage sensor to measure a voltage of the battery; and a control unit to execute and control calculations for estimating the residual capacity, the control unit being configured to approximate the time dependent variation of the open circuit voltage of the battery with the function in which the denominator is the time dependent polynomial of n-th degree, defined as a reciprocal function of n-th degree by the relationship $$V(t) = \frac{1 + A_1 \cdot t + A_2 \cdot t^2 + \ldots + A_{n-1} \cdot t^{n-1}}{B_0 + B_1 \cdot t + B_2 \cdot t^2 + \ldots + B_n \cdot t^n} + F(t) + C,$$

where (t) is an elapsed time from when obtaining a voltage value of the battery is started after the battery has stopped charging/discharging, (n) is an integer greater than two, F(t) is an arbitrary function of the time (t), A and B are coefficients in the reciprocal function of n-th degree, and (C) is a constant;

obtain a number of voltage values of the battery in the predetermined time duration from when the obtaining the voltage value is started, the number of voltage values being equal to or greater than a number of coefficients in the reciprocal function of n-th degree;

determine the values of the coefficients in the reciprocal function of n-th degree based on the obtained voltage values using the method of least squares, or the Kalman filter operation, or the neural network;

calculate the stable open circuit voltage from the reciprocal function of n-th degree using the determined values of the coefficients; and estimate the residual capacity based on the calculated stable open circuit voltage.

5. The device for estimating battery residual capacity of claim 4, wherein the control unit uses $$V(t) = \frac{1 + A_1 \cdot t + A_2 \cdot t^2 + \ldots + A_{n-1} \cdot t^{n-1}}{B_0 + B_1 \cdot t + B_2 \cdot t^2 + \ldots + B_n \cdot t^n} + C$$

for the reciprocal function of n-th degree.

6. The device for estimating battery residual capacity of claim 4 or 5, wherein the control unit approximates the time dependent variation of the open circuit voltage by the reciprocal function of n-th degree during a first time duration between the stopping of charging/discharging and the starting of obtaining the voltage value of the battery, the starting of obtaining the voltage value starting before a first reference time duration, approximates the time dependent variation of the open circuit voltage by the reciprocal function of (n−1)th degree during a second time duration when the starting of obtaining the voltage value starts after the first reference time duration and before a second reference time duration, and similarly approximates the time dependent variation of the open circuit voltage, at every appearance of the duration when the starting of obtaining the voltage value starts after the predetermined reference time duration, with reducing sequentially a degree of the reciprocal function one by one until the first degree is reached.

7. A battery power supply system comprising the device for estimating battery residual capacity of claim 4, and the battery.

8. A battery power supply system comprising the device for estimating battery residual capacity of claim 6, and the battery.

* * * * *